(12) United States Patent
Doran

(10) Patent No.: US 7,896,470 B2
(45) Date of Patent: Mar. 1, 2011

(54) PRINT CARTRIDGE

(75) Inventor: John Doran, Raheny (IE)

(73) Assignee: Hewlett-Packard Development Company, L.P., Houston, TX (US)

( * ) Notice: Subject to any disclaimer, the term of this patent is extended or adjusted under 35 U.S.C. 154(b) by 745 days.

(21) Appl. No.: 11/952,194

(22) Filed: Dec. 7, 2007

(65) Prior Publication Data

US 2009/0147052 A1    Jun. 11, 2009

(51) Int. Cl.
 *B41J 2/14* (2006.01)
 *B41J 2/16* (2006.01)
(52) U.S. Cl. .............................. 347/50; 347/58; 347/86
(58) Field of Classification Search ............... 347/49, 347/50, 58, 67, 85, 86, 108
See application file for complete search history.

(56) References Cited

U.S. PATENT DOCUMENTS

| 5,189,787 | A | 3/1993 | Reed et al. |
| 5,637,166 | A | 6/1997 | Swanson et al. |
| 5,772,829 | A * | 6/1998 | Cowger ............... 156/291 |
| 6,190,002 | B1 | 2/2001 | Spivey |
| 6,802,595 | B2 * | 10/2004 | Mizutani ............... 347/50 |
| 6,902,261 | B2 | 6/2005 | Kim et al. |

OTHER PUBLICATIONS

International Search Report. Mail Date May 29, 2009. International Application No. PCT/US2008/085119. Filing Date Dec. 1, 2008.

* cited by examiner

*Primary Examiner* — Thinh H Nguyen

(57) ABSTRACT

An assembly includes a flexible electrical circuit and a housing having a support surface configured to receive the flexible electrical circuit. A plurality of three-dimensional impressions are symmetrically positioned across the support surface and extending below the support surface. The plurality of three-dimensional impressions are deformed when the flexible circuit is joined to the support surface.

23 Claims, 6 Drawing Sheets

PRINT CARTRIDGE

BACKGROUND

An inkjet printing system may include a printhead, an ink supply which supplies liquid ink to the printhead, and an electronic controller which controls the printhead. The printhead ejects drops of ink through a plurality of nozzles or orifices and toward a print medium, such as a sheet of paper, so as to print onto the print medium. Typically, the orifices are arranged in one or more columns or arrays such that properly sequenced ejection of ink from the orifices causes characters or other images to be printed upon the print medium as the printhead and the print medium are moved relative to each other.

The printhead, also referred to as a printhead die, communicates with the electronic controller via an electrical circuit. In some implementations, the electrical circuit is a flexible circuit secured to a body, such as a printer cartridge, that also supports the printhead. Properly securing the electrical circuit to the body is desirable for reliable printhead operation, as non-uniform or uneven securing of the flexible electrical circuit makes the circuit more susceptible to damage and potentially leads to decreased performance during various printer functions, such as during capping and wiping of the printhead.

Various methods can be used to inspect the connection between the flexible electrical circuit and the supporting body. For example, the strength of the bond between the flexible electrical circuit and the supporting body can be evaluated by measuring the force required to peel the flexible circuit off the supporting body. However, such testing is destructive so it can only be used on a sample of parts, and the peel force does not indicate uniformity of the connection. In another method, a shim is inserted between the flexible circuit and the supporting body to confirm the extent of the connection. However, this method only checks the perimeter of the connection area, and does not indicate how well the elements are secured to each other. Visual inspection for gaps between edges of the flexible circuit and the supporting body may also be conducted, but such visual inspection does not provide any empirical evidence regarding the uniformity or strength of the connection.

For this and other reasons, there is a need for the present invention.

SUMMARY

One embodiment of the present invention provides an assembly comprising a flexible electrical circuit supporting a printhead, and a housing having a support surface configured to receive the flexible electrical circuit. A plurality of three-dimensional impressions are symmetrically positioned across the support surface and extending below the support surface. The plurality of three-dimensional impressions are deformed when the flexible circuit is joined to the support surface.

Another embodiment of the present invention provides a method for joining a flexible electrical circuit to a substrate. In one embodiment the method comprises: arranging a flexible electrical circuit against a support surface of a substrate, where the support surface of the substrate includes at least one three-dimensional impression extending below the support surface; applying pressure and thermal energy to the arranged flexible circuit and joining surface to join the flexible electrical circuit to the support surface; and determining whether the flexible electrical circuit is satisfactorily joined to the substrate by viewing deformation of the at least one three-dimensional impression.

DETAILED DESCRIPTION

In the following detailed description, reference is made to the accompanying drawings which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. In addition, it is to be understood that any element(s), feature(s), structure(s), item(s), etc. of one specific embodiment is not limited to the specific embodiment, and may be used in other embodiments. The following detailed description, therefore, is not to be taken in a limiting sense, and the scope of the present invention is defined by the appended claims.

Figure 1:
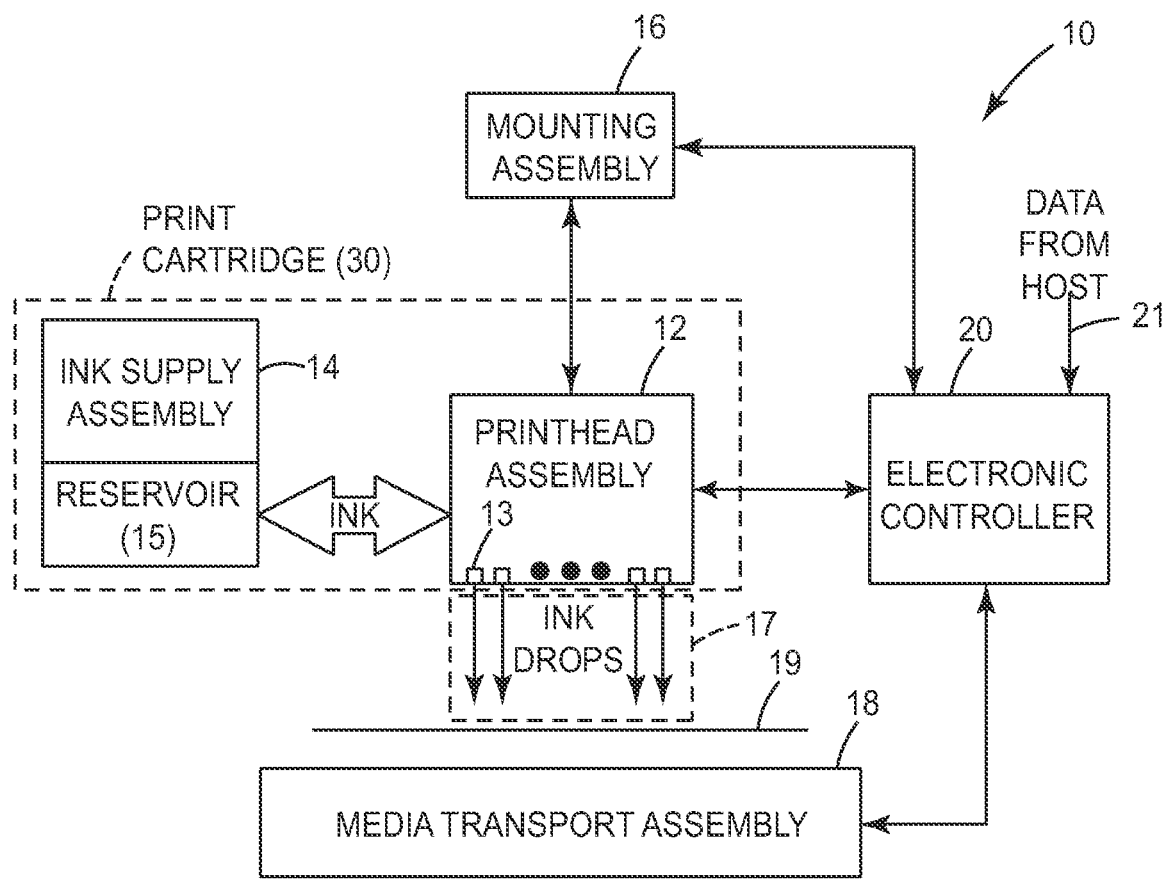
FIG. 1 is a block diagram illustrating one embodiment of an inkjet printing system.

FIG. 1 illustrates one embodiment of an inkjet printing system 10 according to the present invention. Inkjet printing system 10 constitutes one embodiment of a fluid ejection system which includes a fluid ejection device, such as a printhead assembly 12, and a fluid supply, such as an ink supply assembly 14. In the illustrated embodiment, inkjet printing system 10 also includes a mounting assembly 16, a media transport assembly 18, and an electronic controller 20.

Printhead assembly 12, as one embodiment of a fluid ejection device, is formed according to an embodiment of the present invention and ejects drops of ink, including one or more colored inks, through a plurality of orifices or nozzles 13. While the following description refers to the ejection of ink from printhead assembly 12, it is understood that other liquids, fluids, or flowable materials may be ejected from printhead assembly 12.

In one embodiment, the drops are directed toward a medium, such as print media 19, so as to print onto print media 19. Typically, nozzles 13 are arranged in one or more columns or arrays such that properly sequenced ejection of ink from nozzles 13 causes, in one embodiment, characters, symbols, and/or other graphics or images to be printed upon print media 19 as printhead assembly 12 and print media 19 are moved relative to each other.

Print media 19 includes, for example, paper, card stock, envelopes, labels, transparent film, cardboard, rigid panels, and the like. In one embodiment, print media 19 is a continuous form or continuous web print media 19. As such, print media 19 may include a continuous roll of unprinted paper.

Ink supply assembly 14, as one embodiment of a fluid supply, supplies ink to printhead assembly 12 and includes a reservoir 15 for storing ink. As such, ink flows from reservoir 15 to printhead assembly 12. In one embodiment, ink supply assembly 14 and printhead assembly 12 form a recirculating ink delivery system. As such, ink flows back to reservoir 15 from printhead assembly 12. In one embodiment, printhead assembly 12 and ink supply assembly 14 are housed together in an inkjet print cartridge or pen, as identified by dashed line 30. In another embodiment, ink supply assembly 14 is separate from printhead assembly 12 and supplies ink to printhead assembly 12 through an interface connection, such as a supply tube (not shown).

Mounting assembly 16 positions printhead assembly 12 relative to media transport assembly 18, and media transport assembly 18 positions print media 19 relative to printhead assembly 12. As such, a print zone 17 within which printhead assembly 12 deposits ink drops is defined adjacent to nozzles 13 in an area between printhead assembly 12 and print media 19. During printing, print media 19 is advanced through print zone 17 by media transport assembly 18.

In one embodiment, printhead assembly 12 is a scanning type printhead assembly, and mounting assembly 16 moves printhead assembly 12 relative to media transport assembly 18 and print media 19 during printing of a swath on print media 19. In another embodiment, printhead assembly 12 is a non-scanning type printhead assembly, and mounting assembly 16 fixes printhead assembly 12 at a prescribed position relative to media transport assembly 18 during printing of a swath on print media 19 as media transport assembly 18 advances print media 19 past the prescribed position.

Electronic controller 20 communicates with printhead assembly 12, mounting assembly 16, and media transport assembly 18. Electronic controller 20 receives data 21 from a host system, such as a computer, and includes memory for temporarily storing data 21. Typically, data 21 is sent to inkjet printing system 10 along an electronic, infrared, optical or other information transfer path. Data 21 represents, for example, a document and/or file to be printed. As such, data 21 forms a print job for inkjet printing system 10 and includes one or more print job commands and/or command parameters.

In one embodiment, electronic controller 20 provides control of printhead assembly 12 including timing control for ejection of ink drops from nozzles 13. As such, electronic controller 20 defines a pattern of ejected ink drops which form characters, symbols, and/or other graphics or images on print media 19. Timing control and, therefore, the pattern of ejected ink drops, is determined by the print job commands and/or command parameters. In one embodiment, logic and drive circuitry forming a portion of electronic controller 20 is located on printhead assembly 12. In another embodiment, logic and drive circuitry forming a portion of electronic controller 20 is located off printhead assembly 12.

Figure 2:
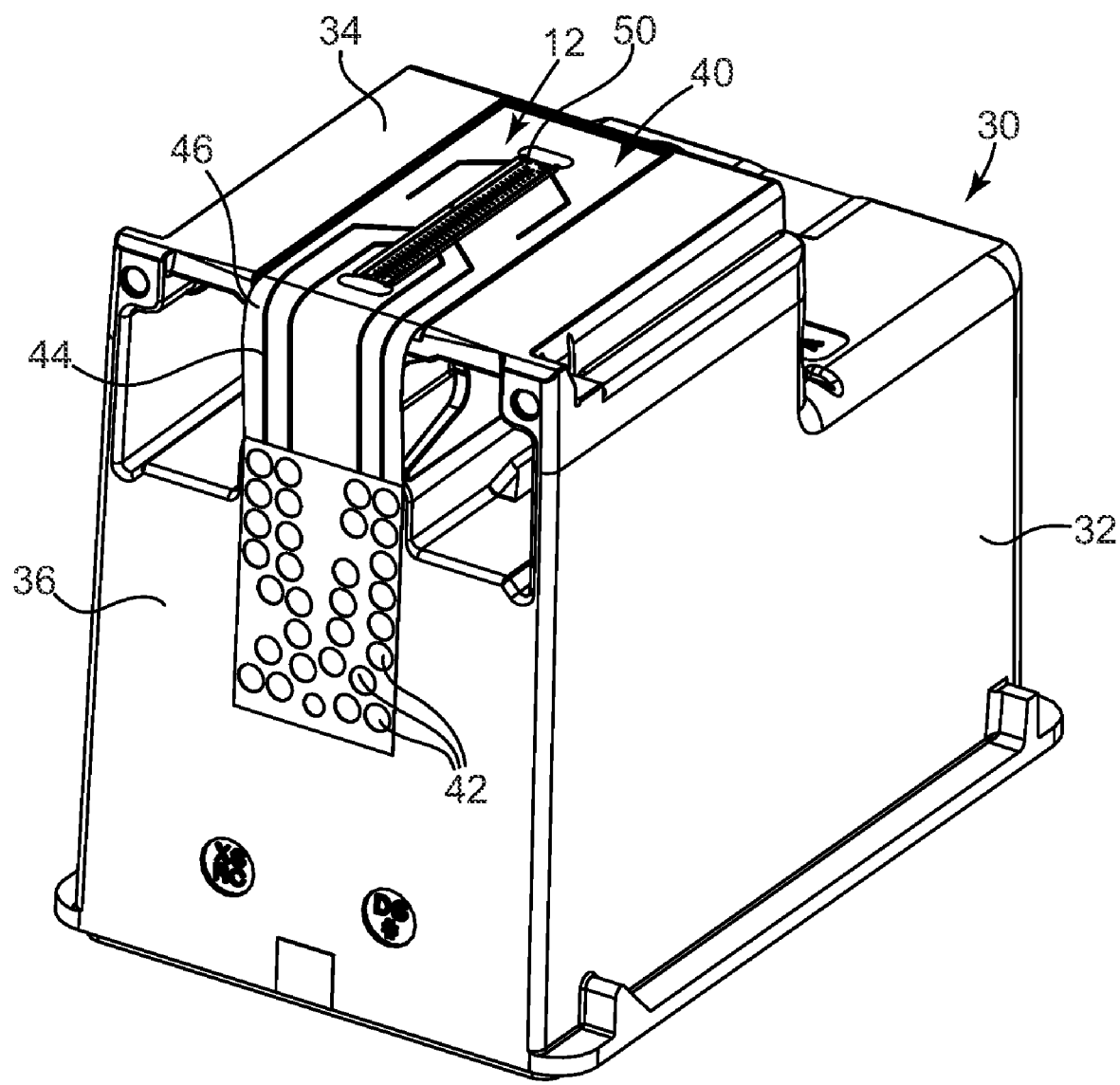
FIG. 2 is a perspective view illustrating one embodiment of an inkjet print cartridge.

In one embodiment, as illustrated in FIG. 2, and as described below, printhead assembly 12 and ink supply assembly 14 are coupled or joined together as an inkjet print cartridge or pen 30. Print cartridge 30 includes a body or housing 32 which supports printhead assembly 12 and contains reservoir 15 (FIG. 1) of ink supply assembly 14. As such, reservoir 15 fluidically communicates with printhead assembly 12 to supply ink to printhead assembly 12. In addition, housing 32 supports an electrical circuit 40 which facilitates communication of electrical signals between electronic controller 20 (FIG. 1) and printhead assembly 12 for controlling and/or monitoring operation of printhead assembly 12.

Electrical circuit 40 includes a plurality of electrical contacts 42 and a plurality of conductive paths 44 which extend between and provide electrical connection between electrical contacts 42 and a printhead die 50. For clarity of the illustrations, only representative conductive paths 44 are shown in FIG. 2, and conductive paths 44 are omitted from the other Figures. Electrical contacts 42 provide points for electrical connection with print cartridge 30 and, more specifically, printhead die 50. As such, electrical contacts 42 facilitate communication of power, ground, and/or data signals to printhead die 50.

In one embodiment, electrical circuit 40 is a flexible electrical circuit. As such, conductive paths 44 are formed in one or more layers of a flexible base material 46. Base material 46 may include, for example, a polyimide or other flexible polymer material (e.g., polyester, poly-methyl-methacrylate) and conductive paths 44 may be formed of copper, gold, or other conductive material.

As will be described below, flexible electrical circuit 40 is used in a thermal bonding process. The base material 46 may therefore be selected to facilitate thermal bonding of flexible electrical circuit 40 to housing 32. Alternately, flexible electrical circuit 40 may comprise a multi-layered element, including a flexible thermo-setting layer positioned for contact with housing 32 during the thermal boding process. Materials suitable for a thermo-setting layer include, for example, polyethylene terephthalate (PET) and ethylene-vinyl acetate-organic acid terpolymer (EVA). In one embodiment, a thermosetting layer itself comprises a multilayer structure. In one embodiment, the thermosetting layer comprises a layer of PET having on either side of the PET a layer of EVA. In one embodiment, a thickness of the thermosetting layer is less than one millimeter. Similarly, the material of housing 32 can be selected so as to facilitate thermal bonding of flexible electrical circuit 40 to housing 32, and/or to provide specific mechanical properties (e.g., a stiff or creep-resistant material to resist deformation due to stresses imparted to housing 32.

Printhead die 50 is joined with or mounted on flexible electrical circuit 40 such that printhead die 50 and flexible electrical circuit 40 are supported by housing 32 of cartridge 30. More particularly, printhead die 50 is supported by housing 32 so as to fluidically communicate with reservoir 15. In one embodiment, flexible electrical circuit 40 is supported on housing 32 of print cartridge 30 such that a portion of flexible electrical circuit 40 connected to printhead die 50 is positioned along a side 34 of housing 32 of print cartridge 30, and another portion of flexible electrical circuit 40 including electrical contacts 42 wraps around and is positioned along an adjacent side 36 of housing 32.

Figure 3:
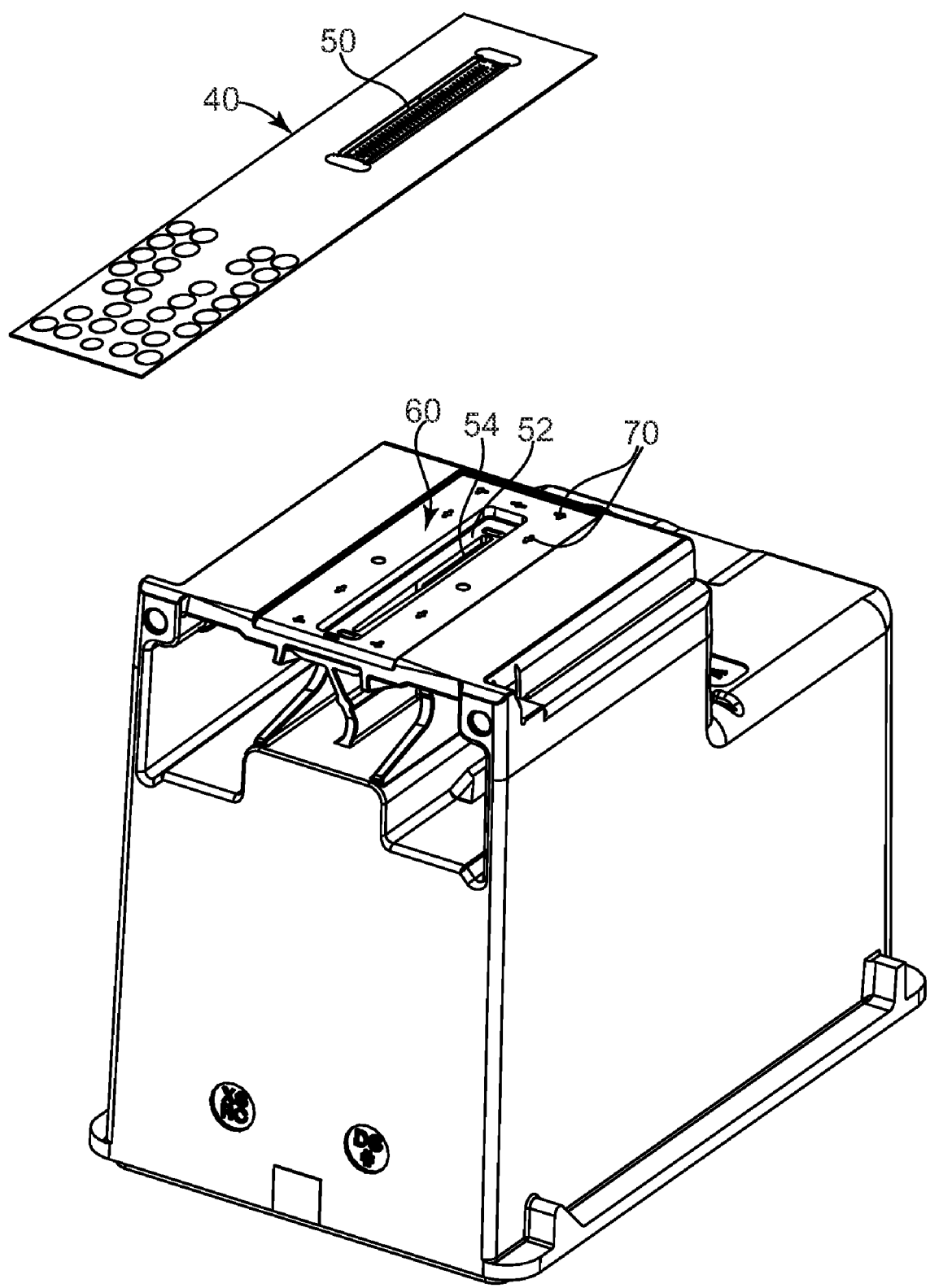
FIG. 3 is an exploded perspective view illustrating one embodiment of the inkjet print cartridge of FIG. 2.

In one embodiment, printhead die 50 and flexible electrical circuit 40 are secured to or mounted on housing 32 so as to provide a fluid-tight seal. Referring now to FIG. 3, in one embodiment, for example, printhead die 50 is secured to or mounted within a pocket 52 of housing 32 by use of adhesive (not shown) between printhead die 50 and housing 32, and flexible electrical circuit 40 is secured to or mounted to housing 32 by use of thermal bonding between flexible electrical circuit 40 and housing 32. In one embodiment, pocket 52 includes various features (e.g., datum pads and/or lockout features) to ensure correct orientation and retention (e.g., press fit) of printhead die 50 within pocket 52. In addition, pocket 52 includes one or more fluid passages 54 formed therethrough and providing fluidic routing from reservoir 15 to printhead die 50.

Figure 4:
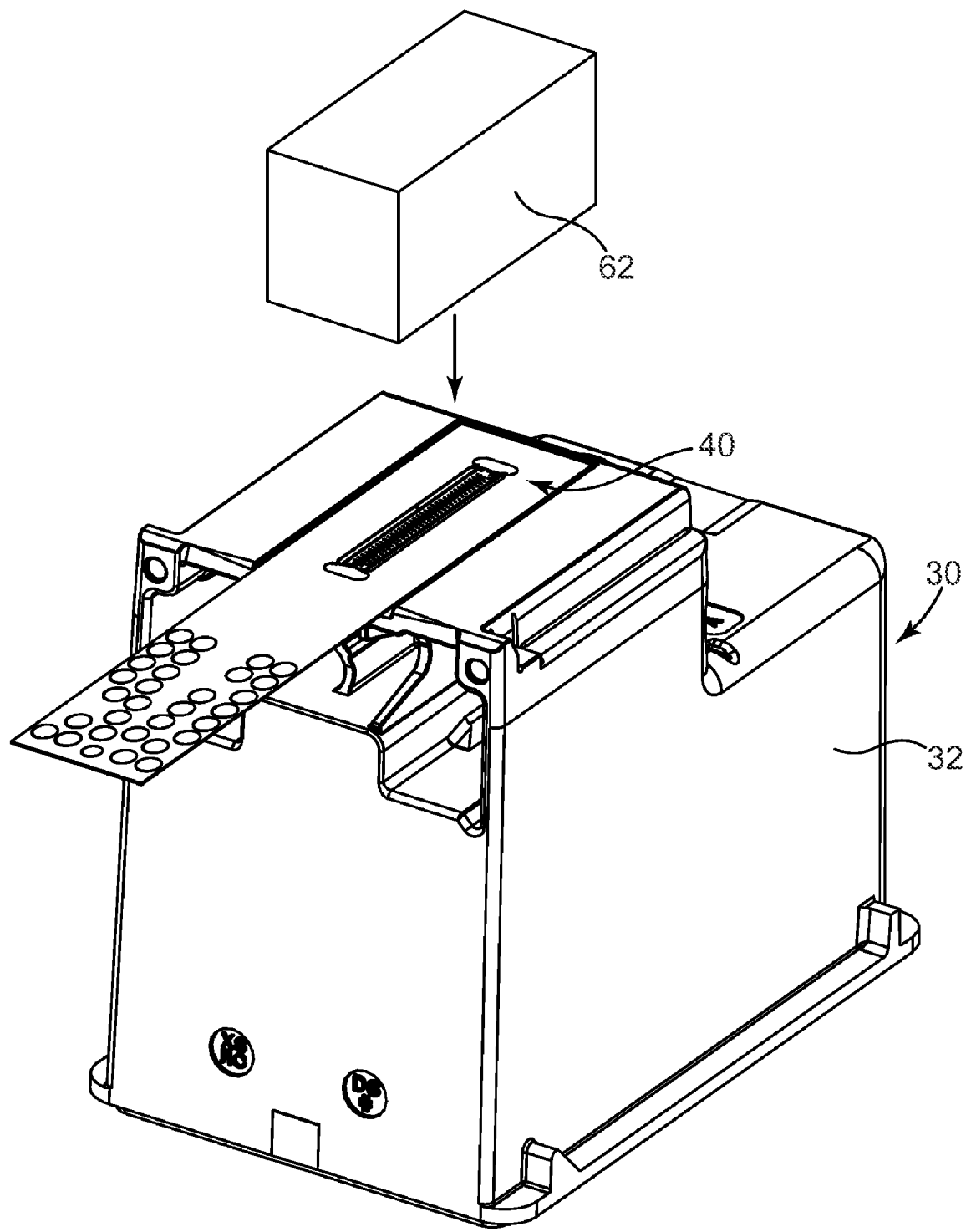
FIG. 4 is a perspective view schematically illustrating thermal bonding of a flexible circuit to a housing of one embodiment an inkjet print cartridge.

Referring to FIGS. 3 and 4, in one embodiment, thermal bonding of electrical circuit 40 to housing 32 is accomplished by positioning flexible electrical circuit 40 against a support surface 60 of housing 32, and then using a heated shoe 62 (schematically represented in FIG. 4) to apply pressure and thermal energy for a predetermined length of time (referred to herein as "staking" electrical circuit 40 to housing 32). In one embodiment, the parameters for staking electrical circuit 40 to housing 32 are as follows (min/target/max):

Temperature: 660/680/500° F.
Pressure: 15/25/30 pounds/inch$^2$ (psi)
Time: 1.5/1.6/1.7 seconds (s)

As described above, properly securing flexible electrical circuit 40 to housing 32 is desirable for reliable printhead operation, as non-uniform or uneven securing of flexible electrical circuit 40 makes the flexible electrical circuit 40 more susceptible to damage and potentially leads to decreased performance during various printer functions.

Figure 5:
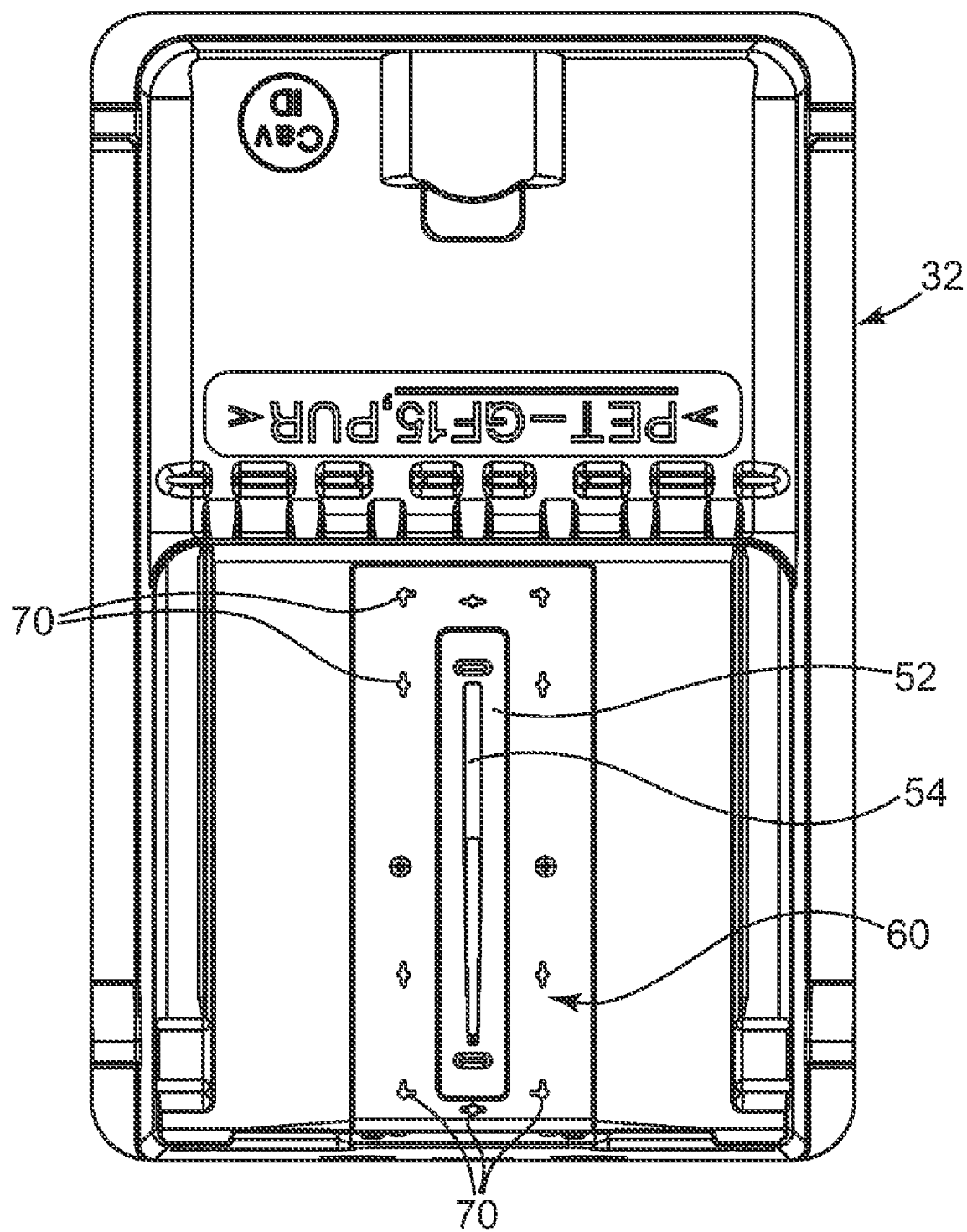
FIG. 5 is a plan view illustrating one embodiment of a flexible circuit support surface having depressions therein.

To aid in determining whether flexible electrical circuit 40 is satisfactorily joined to support surface 60 of housing 32, support surface 60 is molded to include small three-dimensional impressions or depressions 70 symmetrically positioned on support surface 60. FIG. 5 provides a plan view of side 34 of housing 32, showing exemplary positioning of depressions 70. In one embodiment, depressions 70 have a depth in the range of about 10 µm to about 50 µm, and are sufficiently small with respect to the size of support surface 60 that the functionality of the bond between flexible electrical circuit 40 and housing 32 is not affected.

Figure 6A:
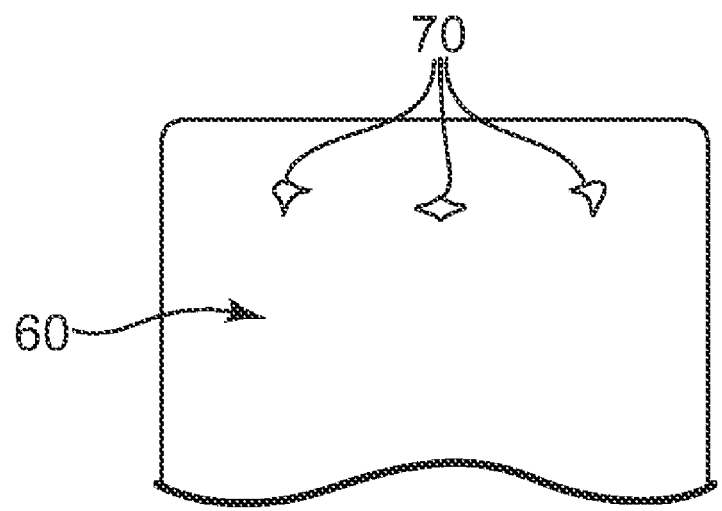
FIGS. 6A and 6B are plan views schematically illustrating deformation of depressions in the support surface of FIG. 5 after thermal bonding of a flexible circuit thereto.
Figure 6B:
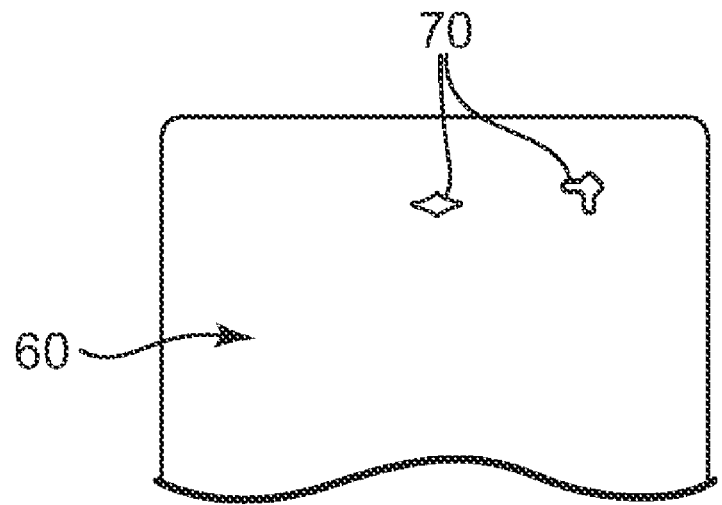

Depressions 70 are shaped so that they deform in a uniform way when heat and pressure is applied by heated shoe 62. The exemplary depressions 70 seen in FIGS. 3 and 5 are generally "X" and "L" shaped, but other shapes may be usefully employed. Deformation of depressions 70 under heat and pressure is also referred to as reflow. By comparing the size/shape of the deformed depressions 70, the staking process can be adjusted to be even and uniform. That is, uniformity of deformation of depressions 70 is indicative of a uniform bond caused by uniform application of pressure and thermal energy by the shoe 62. Referring to FIGS. 6A and 6B, exemplary deformation patterns of depressions 70 are schematically illustrated. By comparing depressions 70 on opposite sides of support surface 60 (i.e., top to bottom and left to right) the staking process can be adjusted until depressions 70 are uniformly deformed. If the depressions 70 are not uniformly deformed across the support surface 60, the pressure applied by shoe 62, the temperature of shoe 62, and/or the time the shoe 62 is pressed against flexible electrical circuit 40 can be modified for subsequent joining operations until uniform deformation of depressions 70 is achieved. In FIG. 6A, depressions 70 are uniformly deformed when comparing the right side to the left side. In FIG. 6B, depressions 70 are not uniformly deformed when comparing the right side to the left side; rather, the right side depression 70 has not been deformed at all, while the left side depression 70 has been completely obliterated by excessive pressure.

In one embodiment, deformed depressions 70 can be viewed directly through flexible electrical circuit 40, when the base material 46 forming flexible electrical circuit 40 is transparent or translucent. In another embodiment, deformed depressions 70 can be viewed by peeling flexible electrical circuit 40 from support surface 60 and then observing depressions 70.

In one embodiment, depressions 70 of different depths are formed in support surface 60. For example, a first set of depressions 70 have a first depth, and a second set of depressions 70 have a second depth deeper than the depth of the first set of depressions 70. The different depths of the depressions 70 are used to "bracket" an acceptable application of pressure and thermal energy. For example, deformation of the shallower first set of depressions 70 is indicative that a minimum required application of heat and pressure has occurred, and no deformation of the deeper second set of depressions 70 is indicative that excessive heat and pressure have not been applied. In one embodiment, the difference in depth between the first and second sets of depressions 70 is at least 20 µm.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for joining a flexible electrical circuit to a substrate, the method comprising:

arranging a flexible electrical circuit against a support surface of a substrate, the support surface of the substrate including at least one three-dimensional impression extending below the support surface;

applying pressure and thermal energy to the arranged flexible circuit and joining surface to join the flexible electrical circuit to the support surface; and determining whether the flexible electrical circuit is satisfactorily joined to the substrate by viewing deformation of the at least one three-dimensional impression.

2. The method of claim 1, wherein viewing deformation of the at least one three-dimensional impression comprises viewing deformation of the at least one three-dimensional impression through the flexible electrical circuit.

3. The method of claim 1, wherein viewing deformation of the at least one three-dimensional impression comprises viewing deformation of the at least one three-dimensional impression by peeling the flexible electrical circuit away from the substrate.

4. The method of claim 1, wherein the at least one three-dimensional impression comprises a plurality of three-dimensional impressions distributed across the support surface, and wherein viewing deformation of the at least one three-dimensional impression comprises viewing deformation of each of the plurality of three-dimensional impressions.

5. The method of claim 4, wherein determining whether the flexible electrical circuit is satisfactorily joined to the substrate comprises observing the uniformity of deformation of the plurality of three-dimensional impressions across the support surface.

6. The method of claim 5, wherein uniformity of deformation is indicative of uniform application of pressure and thermal energy.

7. The method of claim 6, further comprising, if the plurality of three-dimensional impressions are not uniformly deformed across the support surface, adjusting the application of at least one of pressure and thermal energy for subsequent joining of flexible electrical circuits to respective substrates.

8. The method of claim 4, wherein the plurality of three-dimensional impressions comprises a first set of impressions having a first impression depth, and a second set of impressions having a second impression depth deeper than the first impression depth, wherein deformation of the first set of impressions and no deformation of the second set of impressions is indicative of an acceptable application of pressure and thermal energy.

9. The method of claim 8, wherein the second impression depth is at least 20 μm deeper than the first impression depth.

10. The method of claim 1, wherein the at least one three-dimensional impression has a depth in the range of about 10 μm to about 50 μm.

11. The method of claim 1, wherein applying pressure and thermal energy comprises pressing the flexible circuit against the support surface with a heated shoe.

12. An assembly comprising:
a flexible electrical circuit supporting a printhead;
a housing having a support surface configured to receive the flexible electrical circuit; and
a plurality of three-dimensional impressions symmetrically positioned across the support surface and extending below the support surface, wherein the plurality of three-dimensional impressions are deformed when the flexible circuit is joined to the support surface.

13. The assembly of claim 12, wherein the deformed three-dimensional impressions are visible through the flexible electrical circuit.

14. The assembly of claim 12, wherein the electrical circuit includes electrical contacts configured to communicate at least one of a power signal, a ground signal, and a data signal to the printhead.

15. The assembly of claim 12, wherein the plurality of three-dimensional impressions comprises a first set of impressions having a first impression depth, and a second set of impressions having a second impression depth deeper than the first impression depth, wherein deformation of the first set of impressions and no deformation of the second set of impressions is indicative of an acceptable application of pressure and thermal energy.

16. The assembly of claim 15, wherein the second impression depth is at least 20 μm deeper than the first impression depth.

17. The assembly of claim 12, wherein the three-dimensional impressions have a depth in the range of about 10 μm to about 50 μm.

18. A printer cartridge, comprising:
a flexible electrical circuit supporting a printhead; and
a housing having a support surface with integrally formed means for indicating uniform connection of the flexible electrical circuit thereto, wherein the means for indicating uniform connection are visible through the flexible electrical circuit.

19. The printer cartridge of claim 18, wherein the means for indicating uniform connection are responsive to the application of pressure and thermal energy.

20. The printer cartridge of claim 18, wherein the means for indicating uniform connection are symmetrically distributed across the support surface.

21. A method for joining a flexible electrical circuit to a printer cartridge, the method comprising:
positioning a flexible electrical circuit against a support surface of a housing, the support surface including at least two depressions therein, the at least two depressions symmetrically positioned on the support surface;
pressing a heated shoe against the flexible electrical circuit to join the flexible electrical circuit to the support surface, the heated shoe having a predetermined temperature and pressed against the flexible electrical circuit with a predetermined pressure for a predetermined length of time;
viewing the depressions through the flexible electrical circuit to determine if the depressions are similarly deformed; and
if the depressions are not similarly deformed, adjusting the heated shoe for subsequent joining operations.

22. The method of claim 21, wherein adjusting the heated shoe comprises adjusting at least one of temperature of the shoe, pressure applied by the shoe, and length of time pressure is applied by the shoe.

23. The method of claim 21, the depressions have a depth in the range of about 10 μm to about 50 μm.

* * * * *